United States Patent
Kameoka et al.

(10) Patent No.: US 10,408,547 B2
(45) Date of Patent: Sep. 10, 2019

(54) FLATTENED HEAT PIPE AND MANUFACTURING METHOD THEREOF

(71) Applicant: FURUKAWA ELECTRIC CO., LTD., Tokyo (JP)

(72) Inventors: Hideaki Kameoka, Tokyo (JP); Masanobu Sugimura, Tokyo (JP); Tatsuro Miura, Tokyo (JP); Yasumi Sasaki, Tokyo (JP); Hiroshi Okada, Tokyo (JP); Shinichi Furumoto, Tokyo (JP); Masaaki Yamamoto, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 273 days.

(21) Appl. No.: 14/879,821

(22) Filed: Oct. 9, 2015

(65) Prior Publication Data

US 2016/0033206 A1 Feb. 4, 2016

Related U.S. Application Data

(60) Division of application No. 13/355,076, filed on Jan. 20, 2012, now Pat. No. 9,188,396, which is a (Continued)

(30) Foreign Application Priority Data

Jul. 21, 2009 (JP) ................................. 2009-170228

(51) Int. Cl.
  *F28D 15/04* (2006.01)
  *F28D 15/02* (2006.01)
  *H01L 23/427* (2006.01)

(52) U.S. Cl.
  CPC ......... *F28D 15/04* (2013.01); *F28D 15/0233* (2013.01); *F28D 15/046* (2013.01);
  (Continued)

(58) Field of Classification Search
  CPC .... F28D 15/046; F28D 15/0233; F28D 15/04; F28D 15/02; H01L 23/427
  (Continued)

(56) References Cited

U.S. PATENT DOCUMENTS 4,351,388 A * 9/1982 Calhoun ............... F28D 15/046
                                                     165/104.26
6,085,831 A    7/2000 DiGiacomo et al.
(Continued)

FOREIGN PATENT DOCUMENTS

CN   1858539 A   11/2006
CN   1862210 A   11/2006
(Continued)

OTHER PUBLICATIONS

Combined Chinese Office Action and Search Report dated Feb. 14, 2017 in Patent Application No. 201510531436.8 (with partial English translation and English translation of categories of cited documents).

(Continued)

*Primary Examiner* — Christopher R Zerphey
*Assistant Examiner* — Harry E Arant
(74) *Attorney, Agent, or Firm* — Oblon, McClelland, Maier & Neustadt, L.L.P.

(57) ABSTRACT

The invention provides a flattened heat pipe whose vapor flowing passage is not clogged and which has an excellent capillary force. The flattened heat pipe has a closed container formed by flattening a tubular container, a plurality of wick structures arrayed within the container in a longitudinal direction so as to form an acute-angled portion where a capillary force is large at least partially within the container, a hollow portion formed of an outer peripheral surface of the wick structure and an inner wall surface of the container and a working fluid sealed into the container.

4 Claims, 12 Drawing Sheets

Related U.S. Application Data continuation of application No. PCT/JP2009/063368, filed on Jul. 27, 2009.

(52) U.S. Cl.
CPC .... *H01L 23/427* (2013.01); *H01L 2924/0002* (2013.01); *Y10T 29/49353* (2015.01)

(58) Field of Classification Search
USPC .................................................. 165/104.26
See application file for complete search history.

(56) References Cited

U.S. PATENT DOCUMENTS

| | | | |
|---|---|---|---|
| 6,725,810 B2 | 4/2004 | Schwartz | |
| 6,901,994 B1 * | 6/2005 | Jin-Cherng | F28D 15/046 165/104.26 |
| 2001/0047859 A1 | 12/2001 | Ishida et al. | |
| 2006/0162905 A1 | 7/2006 | Hsu | |
| 2007/0006993 A1 | 1/2007 | Meng et al. | |
| 2007/0089864 A1 | 4/2007 | Chang et al. | |
| 2007/0130769 A1 | 6/2007 | Moon et al. | |
| 2008/0142196 A1 * | 6/2008 | Jeng | F28D 15/0233 165/104.26 |
| 2009/0071633 A1 * | 3/2009 | He | F28D 15/046 165/104.26 |
| 2010/0266864 A1 | 10/2010 | Lee | |
| 2010/0319882 A1 | 12/2010 | Lee et al. | |

FOREIGN PATENT DOCUMENTS

| | | | |
|---|---|---|---|
| CN | 1892165 A | 1/2007 | |
| CN | 1955628 A | 5/2007 | |
| JP | 61-52587 | 3/1986 | |
| JP | 2000-074578 | 3/2000 | |
| JP | 2000-074581 | 3/2000 | |
| JP | 2001-033178 | 2/2001 | |
| JP | 2002-213887 | 7/2002 | |
| JP | 2004-198096 | 7/2004 | |
| JP | 2004198096 A * | 7/2004 | ......... F28D 15/0233 |
| JP | 2008-286454 | 11/2008 | |
| JP | 2009-068787 | 4/2009 | |
| JP | 2009-180437 | 8/2009 | |
| TW | 200724844 | 7/2007 | |
| TW | 200923307 | 6/2009 | |
| TW | 201038896 A1 | 11/2010 | |
| TW | 201100736 | 1/2011 | |

OTHER PUBLICATIONS

International Search Report dated Oct. 6, 2009, in PCT/JP2009/063368 filed Jul. 27, 2009.

Office Action dated May 14, 2010, in Japanese Patent Application No. 2008-020172, filed Jan. 31, 2008 (with English language translation).

Office Action dated Sep. 10, 2010, in Japanese Patent Application No. 2008-020172, filed Jan. 31, 2008 (with English language translation).

Office Action dated Sep. 3, 2010, in Japanese Patent Application No. 2010-097261 (with English language translation).

Combined Taiwanese Office Action and Search Report dated Sep. 6, 2012, in Patent Application No. 098125704 (with English-language translation).

Combined Chinese Office Action and Search Report dated Sep. 20, 2012, in Patent Application No. 200980159645.7 (with English-language translation).

Office Action dated Apr. 9, 2013, in Chinese Patent Application No. 200980159645.7 with English translation.

Chinese Notification of Reexamination dated Oct. 9, 2014 in Patent Application No. 200980159645.7 (with English Translation).

Decision of Final Rejection dated Oct. 9, 2013 in Chinese Patent Application No. 200980159645.7 (with English translation).

Office Action dated Aug. 22, 2017 in Chinese Patent Application No. 201510531436.8 (with English language translation).

Chinese Office Action dated Apr. 13, 2018 in Chinese Patent Application No. 201510531436.8 (with English translation).

* cited by examiner

FIG. 13A
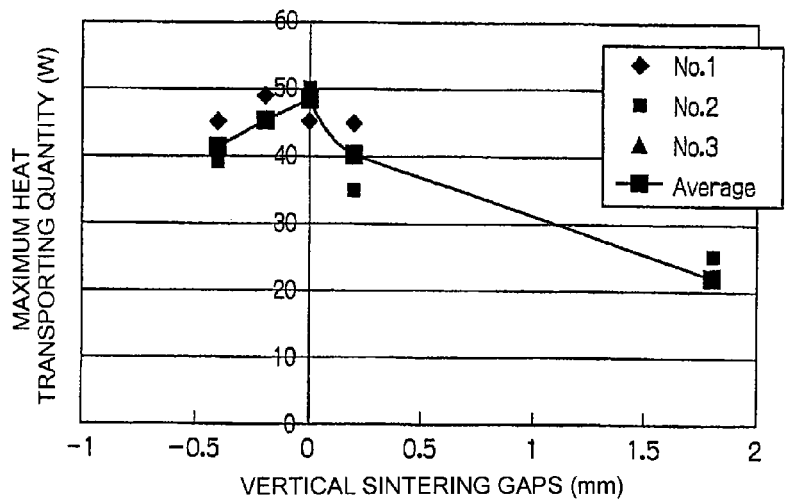
FIG. 13B
| Sample | VERTICAL SINTERING GAPS (mm) | | | | |
|---|---|---|---|---|---|
| | −0.4 | −0.2 | 0 | 0.2 | 1.8 |
| No.1 | 45 | 49 | 45 | 45 | 21 |
| No.2 | 39 | 46 | 50 | 35 | 25 |
| No.3 | 40 | 40 | 50 | 41 | 20 |
| Average | 41.3 | 45.0 | 48.3 | 40.3 | 22.0 |
UNIT : W
FIG. 13C
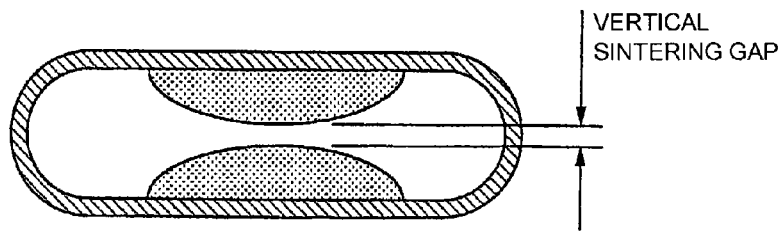

FLATTENED HEAT PIPE AND MANUFACTURING METHOD THEREOF

CROSS-REFERENCE TO RELATED APPLICATIONS

This application is a division of and claims the benefit of priority from U.S. Ser. No. 13/355,076, filed Jan. 20, 2012, which is a continuation application of PCT International Application No. PCT/JP2009/063368, filed Jul. 27, 2009, which claims priority to Japanese Application No. 2009-170228, filed Jul. 21, 2009, the entire contents of each of which are incorporated herein by reference.

TECHNICAL FIELD

The present invention relates to a heat pipe for cooling exothermic elements, heat conducting units and others for example of units to be cooled such as a CPU stored in personal computers, electronic devices and others and more specifically to a flattened heat pipe having a large heat transporting quantity.

BACKGROUND ART

Lately, with remarkable downsizing and increase of performances of electrical devices such as personal computers, it is being strongly demanded to downsize and to save a space of a cooling mechanism for cooling exothermic parts such as MPUs mounted in the electrical devices. Because the MPUs are extremely integrated and carry out calculations, controls and others in high speed, they dissipate a large amount of heat. Then, various cooling systems have been proposed to cool chips and others, i.e., high-speed, high-output and highly integrated parts. Typical one of such cooling systems is a heat pipe.

Because apparent thermal conductivity of the heat pipe excels by about several times to several score times as compared to metals such as copper and aluminum, it is being adopted as a cooling element in various heat-related apparatuses.

The heat pipes include a round pipe-type heat pipe and a plane-type heat pipe in terms of their shapes. The plane-type heat pipe is preferably used for cooling parts to-be-cooled such as a CPU of the electronic devices because it may be readily attached to the parts to-be-cooled and it permits a large contact surface. Along with the downsizing and space-saving of the cooling mechanism, a heat pipe is required to be thinned in such cooling mechanism using the heat pipe.

The heat pipes may be also categorized, in terms of position where the part to-be-cooled is located, into those of a top heat mode in which the part to-be-cooled is located at an upper part and a bottom heat mode in which the part to-be-cooled is located at a lower part. While a fluid refluxes due to the gravity in the bottom heat mode, the fluid must be refluxed against the gravity and then a wick capillary phenomenon is generally utilized in the top heat mode.

The heat pipe is provided with spaces therein as working fluid flowing passages and the working fluid stored in the spaces moves heat by changing its phases such as evaporation and condensation and by moving within the pipe. Operations of the heat pipe in which heat is transported by the phase transformations and move of the working fluid stored in concealed hollow portions will be explained in detail below.

The heat pipe absorbs heat generated by the parts to-be-cooled and thermally conducted through a material of a container composing the heat pipe as latent heat on a heat-absorbing side thereof. Then the working fluid evaporates and its vapor moves to a heat-radiating side of the heat pipe. The vapor of the working fluid radiates the latent heat by condensing at the heat-radiating side and returns to a liquid-phase state. The working fluid thus returned to the liquid-phase state moves again (refluxes) to the heat-absorbing side. Heat is thus moved by the phase transformation and move of the working fluid. The working fluid returned to the liquid-phase state due to the phase transformation moves (refluxes) to the heat-absorbing side by the gravity in a gravity type heat pipe.

In a prior art thin heat pipe fabrication technology, a flattening process is carried out as an additional process after fabricating a heat pipe with combinations of a grooved pipe, of a bear pipe and meshes, of a bear pipe and braided wires, of a bear pipe and sintered metals, of a bear pipe and fine fiber wicks, and others (if a heat pipe is $\varphi 3$ to $\varphi 6$ for example, it is flattened around to 2.0 mm to 4.0 mm thick).

PRIOR ART DOCUMENT

[Patent Document] Japanese Patent Application Laid-open No. 2004-198096

Problems to be Solved by the Invention

The prior art heat pipe (2.0 mm to 4.0 mm) flattened after the fabrication of the heat pipe as described above is now unable to sustain high heat generated by the late CPU and others. This occurs due to an insufficient capillary phenomenon of internal wicks and to clogging of vapor flowing passages caused in the flattening process.

A flow passage area within the tube decreases and the capillary force drops when the grooved pipe is flattened, so that the maximum heat transporting quantity also drops. As for the clogging phenomenon of the vapor flowing passage, there are two types as follows. One type of the phenomena occurs due to a decrease of an inner volume of the heat pipe because it is flattened as a whole. The other type of the phenomena occurs due to that a center part of the flattened heat pipe is indented when the heat pipe is largely flattened (when the heat pipe is thinned).

The heat pipe whose center part is indented causes such problems that its bonding strength to a joint to the CPU and the heat radiating unit becomes inferior and heat resistance increases, ending up dropping a cooling effect of the heat pipe. There is also another problem in terms of the internal structure of the heat pipe that it is unable to obtain a desirable cooling effect because a space through which the working fluid flows becomes narrower than an initial space.

Disclosure of Invention

Accordingly, the invention aims at solving the prior art problems by providing a flattened heat pipe whose vapor flowing passage is not clogged and which has an excellent capillary force.

In order to solve the above-mentioned prior art problems, the inventors of the present invention ardently investigated the problem further. As a result, the inventor found that it is possible to obtain a flattened heat pipe having an excellent capillary force without clogging vapor flowing passages by the following method.

The method includes steps of inserting, at first, a core rod having cutaway portions of a predetermined shape along a longitudinal axis thereof into a tubular container, filling metal powder into spaces formed between the cutaway portions and an inner wall of the container and heating the container to form sintered metals. At this time, the cutaway portions having the predetermined shape are formed into a shape by which refluxing portions that generate a capillary force are formed among the sintered metals or between the sintered metals and the inner wall of the container in a succeeding flattening step.

Then, the core rod is pulled out of the container and the container is flattened so that the sintered metals are located substantially at center parts of the container. Thereby, the refluxing portions that generate the capillary force are formed among the sintered metals or between the sintered metals and the inner wall of the container and the voids are created at curved areas of both sides of the container and at the center part of the container.

The present invention has been made based on results of the investigation described above and according to a first aspect of the flattened heat pipe of the invention, the flattened heat pipe, comprising: a flat and tubular closed container; at least one wick structure; and a working fluid sealed into the container, wherein the wick structure consists of a sintered metal formed of sintered globular or deformed powder, a cross-sectional shape of the wick structure in the container is formed into a semi-elliptical shape having a curved portion and a flat portion, the flat portion of the wick structure is in contact with an inner wall of the container, the curved portion of the wick structure is in contact with or in close proximity to the inner wall of the container by leaving a gap less than a predetermined distance, a capillary force is generated between the curved portion and the inner wall, while a capillary force is also generated in voids formed in the sintered metal, and vapor flowing passages are formed at least in curved areas of both sides of the container.

According to a second aspect of the flattened heat pipe of the invention, the wick structure is formed of a substantially same thickness as a whole.

According to a third aspect of the flattened heat pipe of the invention, a thickness of the wick structure is changed so as to be thicker in a high-temperature portion where an exothermic element is disposed than in a low-temperature portion where none of exothermic elements are disposed. That is, the low-temperature portion is a place where no exothermic element is disposed on.

According to a fourth aspect of the flattened heat pipe of the invention, a thickness of the container is changed so as to be thinner in a high-temperature portion where an exothermic element is disposed than in a low-temperature portion where none of exothermic elements are disposed.

According to fifth and sixth aspects of the heat pipe of the invention, a distance from an apex of the curved portion of the wick structure to the inner wall of the container is equal to 1.0 mm or less than 1.0 mm.

According to seventh to twelfth aspects of the flattened heat pipe of the invention, a concavo-convex portion is formed on the inner wall in a longitudinal direction of the container and the container itself creates a capillary force.

According to a thirteenth aspect of the flattened heat pipe of the invention, the flattened heat pipe, comprising: a flat and tubular closed container; a plurality of wick structures; and a working fluid sealed into the container, wherein the wick structures consist of sintered metals formed of sintered globular or deformed powder, cross-sectional shapes of the wick structures in the container are respectively formed into semi-elliptical shapes having curved portions and flat portions, the flat portions of the wick structures are in contact with an inner wall of the container, the curved portions of neighboring wick structures are in contact with or in close proximity to each other by leaving a gap less than a predetermined distance, a capillary force is generated between neighboring curved portions, while a capillary force is also generated in voids formed in the sintered metals, and vapor flowing passages are formed at least in curved areas of both sides of the container.

According to a fourteenth aspect of the flattened heat pipe of the invention, the wick structure is formed of a substantially same thickness as a whole.

According to a fifteenth aspect of the flattened heat pipe of the invention, a thickness of the wick structure is changed so as to be thicker in a high-temperature portion where an exothermic element is disposed than in a low-temperature portion where none of exothermic elements are disposed.

According to a sixteenth aspect of the flattened heat pipe of the invention, a thickness of the container is changed so as to be thinner in a high-temperature portion where an exothermic element is disposed than in a low-temperature portion where none of exothermic elements are disposed.

According to seventeenth and eighteenth aspects of the flattened heat pipe of the invention, a distance between neighboring curved portions of the wick structures is equal to 1.0 mm or less than 1.0 mm.

According to nineteenth and twentieth aspects of the flattened heat pipe of the invention, the plurality of wick structures are disposed respectively on parts opposite each other of the inner wall of the container.

According to twenty first to twenty eighth aspects of the flattened heat pipe of the invention, a concavo-convex portion is formed on the inner wall in a longitudinal direction of the container and the container itself creates a capillary force.

According to a first aspect of a manufacturing method of the flattened heat pipe of the invention, the method comprising steps of: inserting a core rod, having a cross sectional shape in which one part is cut from a substantially circular shape so as to form a flat cutaway portion, into a tubular contoured object of which one end is concealed or having a narrower diameter; filling metal powder into a space formed by the cutaway portion and an inner wall of the tubular contoured object; heating the tubular contoured object in a state in which the core rod is inserted to prepare a sintered metal in contact with the inner wall; pulling the core rod out of the tubular contoured object; and pressing and deforming the tubular contoured object to form a deformed container so that the sintered metal is in contact with the inner wall or in close proximity to the inner wall with a gap less than a predetermined distance.

According to a second mode of the manufacturing method of the flattened heat pipe of the invention, the core rod has a substantially same cross-sectional shape from one end of the core rod to another end of the core rod.

According to a third mode of the manufacturing method of the flattened heat pipe of the invention, the flat cutaway portion is smaller in one end of the core than in another end of the core rod.

According to a fourth mode of the manufacturing method of the flattened heat pipe of the invention, the method comprising steps of: inserting a core rod, having a cross sectional shape in which a plurality of parts are cut from a substantially circular shape so as to form flat cutaway portions, into a tubular contoured object of which one end is concealed or having a narrower diameter; filling metal powder into spaces formed by the cutaway portions and an inner wall of the tubular contoured object; heating the tubular contoured object in a state in which the core rod is inserted to prepare sintered metals in contact with the inner wall; pulling the core rod out of the tubular contoured object; and pressing and deforming the tubular contoured object to form a deformed container so that the sintered metals are in contact with each other or in close proximity to each other with a gap less than a predetermined distance.

According to a fifth mode of the manufacturing method of the flattened heat pipe of the invention, the core rod has a substantially same cross-sectional shape from one end of the core rod to another end of the core rod.

According to a sixth mode of the manufacturing method of the flattened heat pipe of the invention, the flat cutaway portion is smaller in one end of the core than in another end of the core rod.

Advantageous Effects of the Invention

According to one aspect of the invention, the wicks formed of the sintered metals thermally contact with the whole flat portion of the inner wall of the flattened container that is in contact with the heat source, so that heat density becomes small and heat can be moved efficiently.

Still more, because the refluxing portions containing the acute-angled portions are formed among the sintered metals or between the sintered metals and the inner wall of the container and because the capillary force strongly acts especially in the refluxing portions formed by the acute-angled portions, among the curved portions of the sintered metals or by the curved portion of the sintered metal and the inner wall of the container, the working fluid moves quickly by the capillary force from the heat radiating portion to the heat absorbing portion in the longitudinal direction of the container and heat transporting ability can be enhanced.

In the same time, the curved areas on the both sides of the container not contacting with the heat source become the void or hollow portion fully assured as the vapor flowing passage. Accordingly, the invention can provide the flattened heat pipe having the excellent capillary force without clogging the vapor flowing passage.

BRIEF DESCRIPTION OF DRAWINGS

FIG. 13A is a graph showing a relationship between vertical sintering gaps and maximum heat transporting quantities, FIG. 13B is a table showing the maximum heat transporting quantities when the vertical sintering gaps are changed and FIG. 13C is a diagram explaining the vertical sintering gap.

BEST MODE FOR CARRYING OUT THE INVENTION

A flattened heat pipe of the invention will be explained in detail below with reference to the drawings.

According to one mode of the invention, the flattened heat pipe has a closed container formed by flattening a tubular container, a plurality of wick structures arrayed in contact with each other in a vertical or horizontal direction in a flat cross-section of the container, a working fluid sealed into the container and a hollow portion through which the gas-phase working fluid passes through, wherein parts where the wick structures are in contact with each other form acute-angled portions.

In the heat pipe, the wick structures are formed of a plurality of tubular meshes, upper and lower ends of the tubular meshes contact respectively with upper and lower inner walls of the container, a side surface of the tubular mesh contacts with a side surface of the neighboring tubular mesh and the acute-angled portion is formed of at least one of the part where the upper end of the tubular mesh contacts with the upper inner wall of the container, the part where the lower end of the tubular mesh contacts with the lower inner wall of the container and the part where the side surfaces of the tubular meshes.

Figure 1:
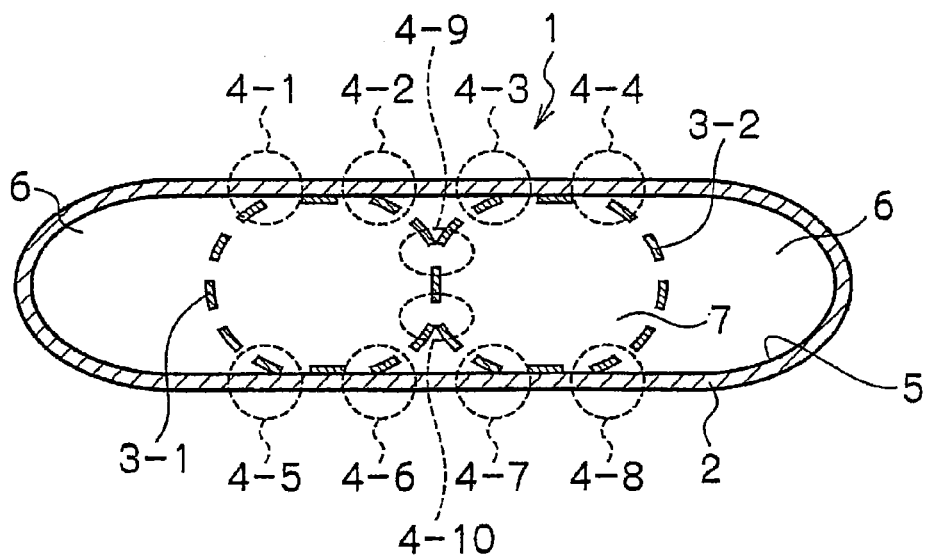
FIG. 1 is a section view explaining one mode of a flattened heat pipe of the invention.

FIG. 1 is a section view explaining one mode of the flattened heat pipe of the invention. As shown in FIG. 1, a flattened heat pipe 1 has a closed container 2 formed by flattening a tubular container, a wick structure 3 composed of a plurality of wicks 3-1 and 3-2 arrayed within the container 2 in a longitudinal direction so as to form an acute-angled portion 4 whose capillary force is large at least partially within the container 2, a hollow portion 6 formed of an outer peripheral surface of the wick structure 3 and an inner wall surface 5 of the container 2 and a working fluid sealed into the container 2. In this mode, the wicks 3-1 and 3-2 are also provided with hollow portions at center parts thereof.

In the mode of the flattened heat pipe shown in FIG. 1, the wick structure 3 is composed of the two tubular meshes 3-1 and 3-2, upper and lower end of the tubular meshes 3-1 and 3-2 contact respectively with upper and lower inner walls 5 of the container 2, a side surface of the tubular mesh 3-1 contacts with a side surface of the neighboring tubular mesh 3-2 and the acute-angled portions 4 are formed of contact portions 4-1, 4-2, 4-3 and 4-4 of the upper ends of the tubular meshes 3-1 and 3-2 and the upper inner wall 5 of the container 2, contact portions 4-5, 4-6, 4-7 and 4-8 of the lower ends of the tubular meshes 3-1 and 3-2 and the lower inner wall of the container 2 and contact portions 4-9 and 4-10 of the side surfaces of the tubular meshes 3-1 and 3-2.

The capillary force strongly acts especially in the acute-angled portions and the working fluid moves quickly by the capillary force in the container through the above-mentioned contact portions 4-1 through 4-10 in the longitudinal direction. It is then possible to fully assure the hollow portion 7 within the tubular mesh of the flattened container and the hollow portion 6 formed by the outer peripheral surface of the wick structure 3 and the inner wall surface 5 of the container 2 as flow passages, i.e., as vapor flowing passages, where the vaporized working fluid flows. Because the plurality of flexible tubular wicks are disposed in the container in the longitudinal direction as the wick structure within the container in this embodiment, it is possible to easily assure the above-mentioned acute-angled portions and the hollow portions as the vapor flowing passages and to move heat efficiently even if the flattened heat pipe is flattened.

Figure 2:
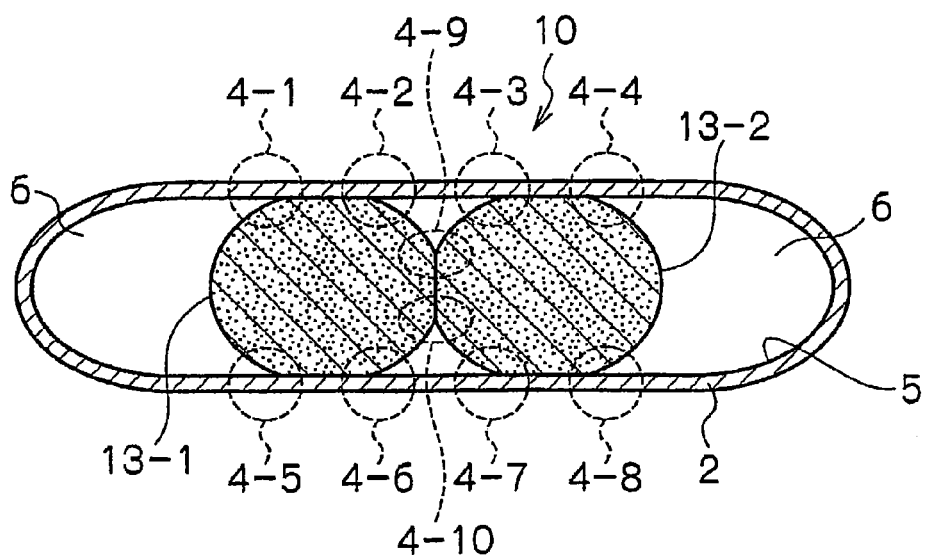
FIG. 2 is a section view explaining another mode of the flattened heat pipe of the invention.

FIG. 2 is a section view explaining another mode of the flattened heat pipe of the invention. As shown in FIG. 2, a flattened heat pipe 10 of the present mode has the closed container 2 formed by flattening a tubular container, a wick structure 13 disposed within the container 2 in the longitudinal direction, the hollow portion 6 and the working fluid sealed into the container 2.

The wick structure 13 described above is composed of two round i.e., columnar sintered metals 13-1 and 13-2, upper and lower end of the columnar sintered metals 13-1 and 13-2 contact respectively with upper and lower inner walls 5 of the container 2, a side surface of the columnar sintered metal 13-1 contacts with a side surface of the neighboring columnar sintered metal 13-2 and the acute-angled portions 4 are formed of contact portions 4-1, 4-2, 4-3 and 4-4 of the upper ends of the columnar sintered metals 13-1 and 13-2 and the upper inner wall 5 of the container 2, contact portions 4-5, 4-6, 4-7 and 4-8 of the lower ends of the columnar sintered metals 13-1 and 13-2 and the lower inner wall of the container 2 and contact portions 4-9 and 4-10 of the side surfaces of the columnar sintered metals 13-1 and 13-2.

As described above, the capillary force strongly acts especially in the acute-angled portions 4 and the working fluid moves quickly by the capillary force in the container through the contact portions 4-1 through 4-10 from the heat radiating portion to the heat absorbing portion in the longitudinal direction of the container. In the same time, it is possible to fully assure the hollow portions 6 formed by the outer peripheral surface of the columnar sintered metals 13-1 and 13-2 and the inner wall surface 5 of the flattened container 2 as flow passages, i.e., as vapor flowing passages, where the vaporized working fluid flows from the heat absorbing portion to the heat radiating portion in the longitudinal direction of the container.

Next, a manufacturing method of the flattened heat pipe of the invention shown in FIG. 2 will be explained. That is, the flattened heat pipe of the invention is fabricated through a process comprising steps of preparing a tubular container, inserting a core rod having cutaway portions of a predetermined shape (i.e., a shape of forming acute-angled portions 4 between the container inner wall or among themselves) in a longitudinal direction into the container, filling metal powder into spaces formed by the cutaway portions and the inner wall of the container, heating the container into which the metal powder and core rod are inserted, sintering the metal powder to form sintered metal, pulling the core rod out of the container, flattening the container and sealing a working fluid into the container.

Figure 6A:
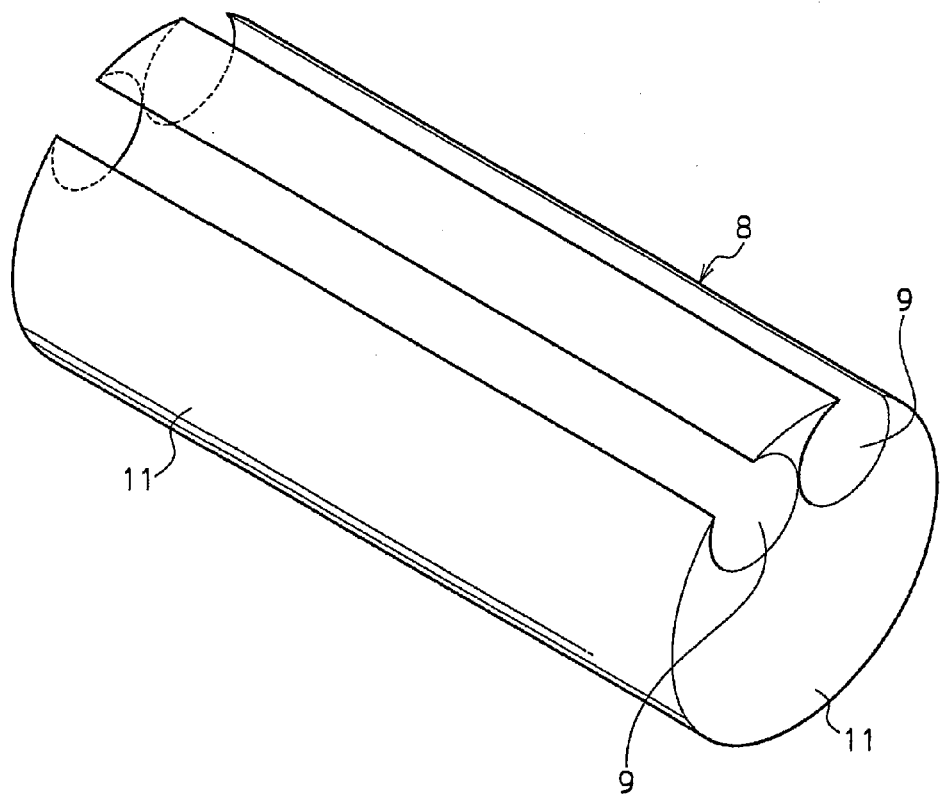
FIG. 6A is a perspective view showing a core rod having cutaway portions and used in a manufacturing method of the invention and FIG. 6B is a section view showing a state in which the core rod is inserted into a tubular container.

The manufacturing method of the flattened heat pipe of the invention will be explained with reference to FIGS. 6A and 6B. FIG. 6A is a perspective view showing a core rod having cutaway portions and FIG. 6B is a section view showing a state in which the core rod is inserted into a tubular container.

At first, a substantially cylindrical tubular container is prepared. Then, as shown in FIG. 6A, a columnar core rod 8 that can be inserted into the inner wall of the tubular container without any gap is provided with two columnar portions 9 whose cross-sections are substantially circular at part along the longitudinal axis of the core rod 8. The two columnar cutaway portions 9 are disposed so that their respective side surfaces are in close proximity as much as possible. The core rod 8 in which the cutaway portions 9 are formed as described above is inserted into the tubular container 2. At this time, the core rod 8 is inserted into the container 2 so that the outer peripheral surface 11 of the core rod 8 contacts with the inner wall 5 of the container 2 substantially without any gap.

When the core rod is inserted into the container as described above, two lengthy columnar spaces whose cross-sections are substantially circular are formed along the longitudinal direction of the container by the columnar cutaway portions formed in the core rod and the inner wall of the container.

Figure 6B:
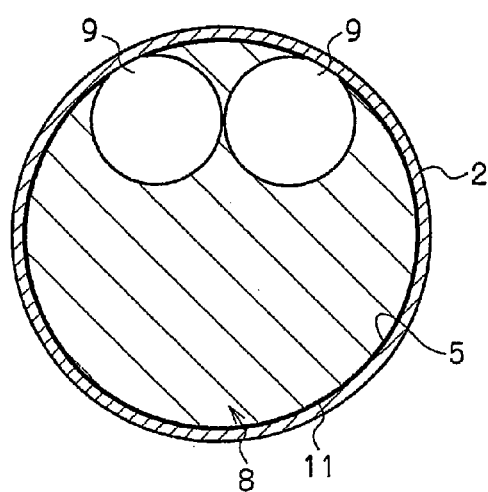

As shown in FIG. 6B, the columnar core rod 8 having the cutaway portions 9 is inserted into the cylindrical container 2 in a state in which there is almost no gap between the inner wall 5 of the container 2. Because the cutaway portions 9 are columnar as described above, the two contiguous columnar spaces whose cross-sections are substantially circular are formed by the inner wall 5 of the container 2 and the two cutaway portions 9.

Metal powder is filled into the columnar lengthy spaces formed by inserting the columnar core rod having the cutaway portions into the cylindrical container as described above. A material of the metal powder is bronze, stainless or the like for example. The powder may be globular or deformed powder. It is possible to adjust voids of the sintered metals described later by controlling size of the metal powder.

The sintered metals are formed in contact with part of the inner wall of the container by heating the container at predetermined temperature, i.e., at temperature around a melting point of the metal powder, in a state in which the metal powder is filled into the two columnar lengthy spaces whose cross-sections are substantially circular. The sintered metals are formed in a state in which the metal powders are linked. Because the metal powders are formed so that they are linked as described above and the acute-angled parts where the capillary force is strong are formed throughout the whole part, the working fluid moves readily.

Next, the core rod is pulled out of the container. When the core rod is pulled out of the container, the sintered metals formed in the spaces formed by the cutaway portions of the core rod and the inner wall of the container are left in contact with the inner wall of the container. That is, the two columnar lengthy sintered metals whose cross-sections are substantially circular are formed in contact with the inner wall of the cylindrical container and in a state in which the side surfaces of the columnar sintered metals contact with each other.

FIG. 2 is a section view showing a state in which the container in which sintered metals are formed as described above is flattened. As shown in FIG. 2, the sintered metals 13-1 and 13-2 are located at a horizontal part of the container 2 and curved areas on both sides of the container are opened respectively as void portions to assure the vapor flowing passages of the working fluid. A thin heat pipe is formed by sealing the working fluid into the flattened container formed as described above. It is noted that as it has been explained with reference to FIG. 2, the capillary force acts strongly especially in the acute-angled portions 4 and the working fluid quickly refluxes by the capillary force from the heat radiating portion to the heat absorbing portion along the longitudinal direction of the container through the contact portions 4-1 through 4-10.

Flattened portions at center parts of the container are required to have flatness to thermally connect with a heat source.

Figure 3:
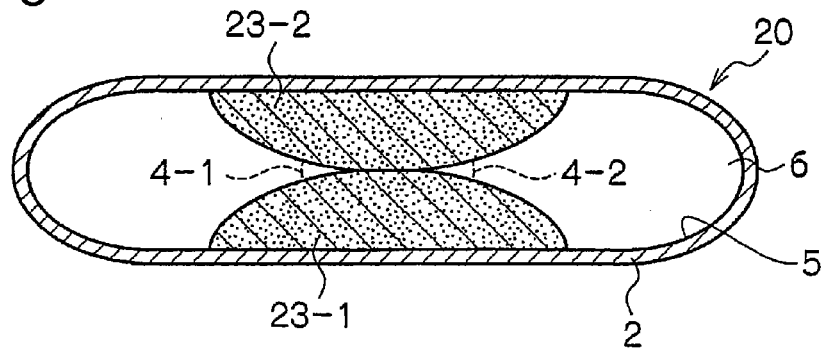
FIG. 3 is a section view explaining a still other mode of the flattened heat pipe of the invention.

FIG. 3 is a section view explaining a still other mode of the flattened heat pipe of the invention. As shown in FIG. 3, a flattened heat pipe 20 of the invention has the closed container 2 formed by flattening a tubular container, a wick structure 23 disposed within the container 2 in the longitudinal direction, the hollow portion 6 and the working fluid sealed into the container 2.

The wick structure 23 described above is composed of two semi-elliptical columnar sintered metals 23-1 and 23-2, upper and lower end of the semi-elliptical columnar sintered metals 23-1 and 23-2 contact respectively with the upper and lower inner walls 5 of the container 2, an apex of the semi-elliptical columnar sintered metal 23-1 contacts with an apex of the facing semi-elliptical columnar sintered metal 23-2 and acute-angled portions 4 are formed of contact portions 4-1 and 4-2 formed by the respective apexes of the semi-elliptical columnar sintered metals 23-1 and 23-2.

As described above, the capillary force strongly acts especially in the acute-angled portions and the working fluid moves quickly by the capillary force in the container through the above-mentioned contact portions 4-1 and 4-2 formed by the respective apexes from a heat radiating portion to a heat absorbing portion in the longitudinal direction. In the same time, it is possible to fully assure the hollow portions 6 formed by the outer peripheral surface of the semi-elliptical columnar sintered metals 23-1 and 23-2 and the inner wall surface 5 of the flattened container 2 as flow passages, i.e., as vapor flowing passages, where the vaporized working fluid flows from the heat absorbing portion to the heat radiating portion in the longitudinal direction of the container.

Figure 7:
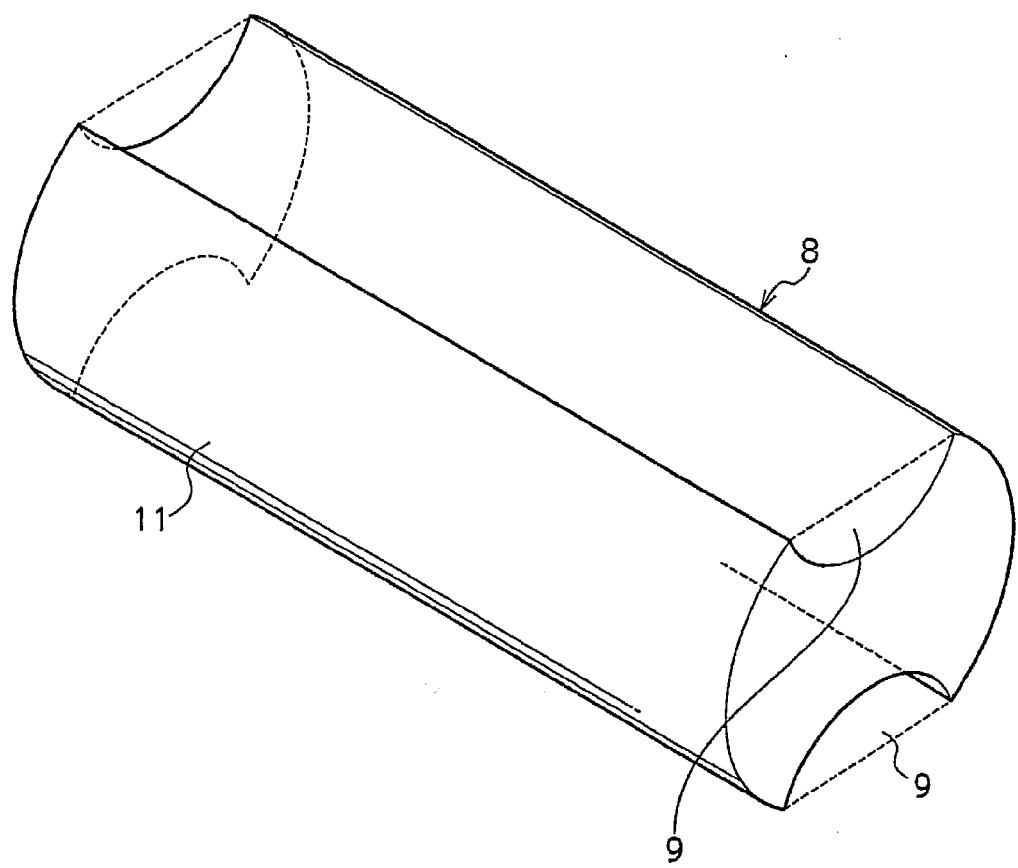
FIG. 7 is a perspective view explaining a core rod having cutaway portions and used in fabricating the flattened heat pipe shown in FIG. 3.

FIG. 7 is a perspective view explaining a core rod having cutaway portions and used in fabricating the flattened heat pipe shown in FIG. 3.

At first, an elliptical tubular container whose cross-section is substantially elliptical is prepared. FIG. 7 shows an elliptical columnar core rod 8 whose cross-section is elliptical and the core rod 8 can be inserted into the elliptical tubular container with almost no gap between the core rod 8 and the inner wall of the container. At a part of the core rod 8, cutaway portions, whose cross-sections are substantially semi-elliptical, are provided along the longitudinal axis of the core rod 8. The core rod 8 in which the cutaway portions 9 are formed as described above is inserted into the elliptical tubular container 2. At this time, the core rod 8 is inserted into the container 2 so that the outer peripheral surface 11 of the core rod 8 contacts with the inner wall 5 of the container 2 substantially without any gap.

When the core rod is inserted into the container as described above, two lengthy spaces whose cross-sections are substantially semi-elliptical are formed so as to face with each other with a predetermined distance along the longitudinal direction of the container by the semi-elliptical cutaway portions formed in the core rod and the inner wall of the container.

The core rod 8 having the two cutaway portions 9 whose cross-sections are semi-elliptical is inserted into the elliptical tubular container 2 in a state in which there is almost no gap between the inner wall 5 of the container 2.

By inserting the elliptical columnar core rod having the cutaway portions into the container, two lengthy spaces opposite (facing) each other are formed. Metal powder is then filled into the lengthy spaces. Then, sintered metals are formed in contact with part of the inner wall of the container by heating the container at predetermined temperature, i.e., at temperature around a melting point of the metal powder, in a state in which the metal powder is filled into the two lengthy spaces whose cross-sections are substantially semi-elliptical.

Next, the core rod is pulled out of the container. When the core rod is pulled out of the container, the sintered metals formed in the spaces formed by the cutaway portions of the core rod and the inner wall of the container are left in contact with the inner wall of the container. When the container is flattened so that the apexes of the semi-elliptical columnar sintered metals contact with each other in this state, the flattened container having a cross-section as shown in FIG. 3 can be obtained and the flattened heat pipe can be fabricated by sealing working fluid.

Figure 4:
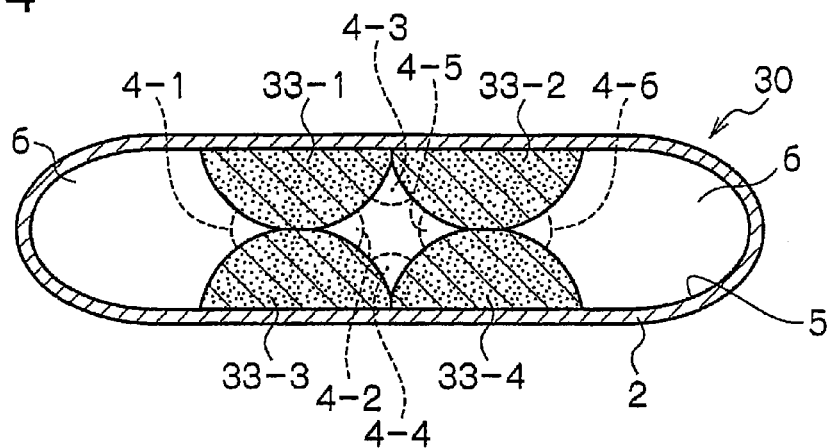
FIG. 4 is a section view explaining a different mode of the flattened heat pipe of the invention.

FIG. 4 is a section view explaining a different mode of the flattened heat pipe of the invention. As shown in FIG. 4, a flattened heat pipe 30 of the invention has the closed container 2 formed by flattening a tubular container, a wick structure 33 disposed within the container 2 in the longitudinal direction, the hollow portion 6 and the working fluid sealed into the container 2.

The wick structure 33 described above is composed of four semi-columnar sintered metals 33-1 through 33-4, upper and lower end of the semi-columnar sintered metals 33-1 through 33-4 contact respectively with the upper and lower inner walls 5 of the container 2, apexes of the semi-columnar sintered metals 33-1 and 33-2 contact respectively with apexes of the facing semi-columnar sintered metals 33-3 and 33-4 and acute-angled portions 4 are formed of contact portions 4-1, 4-2, 4-5 and 4-6 formed by the respective apexes of the semi-columnar sintered metals 33-1, 33-2, 33-3 and 33-4, a contact portion 4-3 formed by side surfaces of the semi-columnar sintered metals 33-1 and 33-2 and a contact portion 4-4 formed by side surfaces of the semi-columnar sintered metals 33-3 and 33-4.

As described above, the capillary force strongly acts especially in the acute-angled portions 4 and the working fluid moves quickly by the capillary force in the container through the contact portions 4-1, 4-2, 4-5 and 4-6 formed by the respective apexes and the contact portions 4-3 and 4-4 formed by the side surfaces from the heat radiating portion to the heat absorbing portion in the longitudinal direction. In the same time, it is possible to fully assure the hollow portions 6 formed by the outer peripheral surface of the semi-columnar sintered metals 33-1, 33-2, 33-3 and 33-4 and the inner wall surface 5 of the flattened container 2 as flow passages, i.e., as vapor flowing passages, where the vaporized working fluid flows from the heat absorbing portion to the heat radiating portion in the longitudinal direction of the container.

Figure 8:
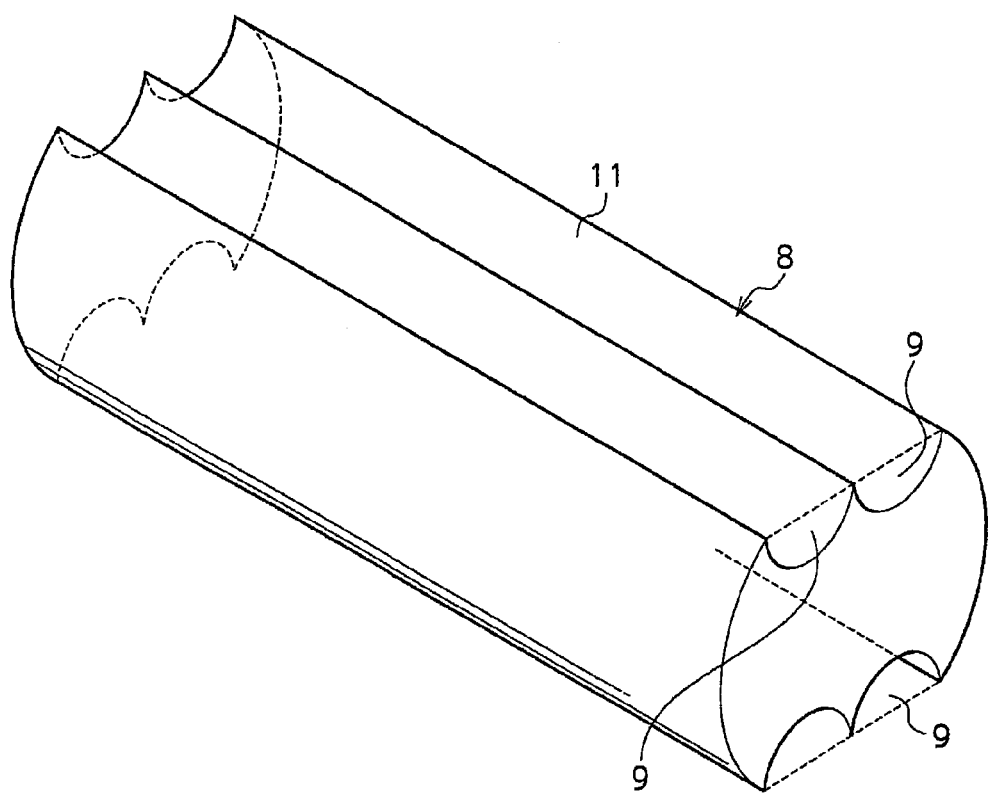
FIG. 8 is a perspective view explaining a core rod having cutaway portions and used in fabricating the flattened heat pipe shown in FIG. 4.

FIG. 8 is a perspective view explaining a core rod having cutaway portions and used in fabricating the flattened heat pipe shown in FIG. 4.

At first, an elliptical tubular container whose cross-section is substantially elliptical is prepared. FIG. 8 shows an elliptical columnar core rod 8 whose cross-section is substantially elliptical and the core rod 8 can be inserted into the elliptical tubular container with almost no gap between the core rod 8 and the inner wall of the container. Four cutaway portions 9, whose cross-sections are substantially semi-circular, are provided partly on the core rod 8 along the longitudinal axis of the core rod 8. The core rod 8 in which the four cutaway portions 9 are formed as described above is inserted into the elliptical tubular container 2. At this time, the core rod 8 is inserted into the container 2 so that the outer peripheral surface 11 of the core rod 8 contacts with the inner wall 5 of the container 2 substantially without any gap.

When the core rod is inserted into the container as described above, four lengthy spaces whose cross-sections are substantially semi-circular are formed so as to face with each other with a predetermined distance along the longitudinal direction of the container by the four semi-circular cutaway portions formed in the core rod and the inner wall of the container.

The core rod 8 having the four cutaway portions 9 whose cross-sections are semi-circular is inserted into the elliptical tubular container 2 in a state in which there is almost no gap between the inner wall 5 of the container 2.

By inserting the elliptical columnar core rod having the cutaway portions into the container, a pair of two lengthy spaces opposite each other are formed. Metal powder is then filled into the lengthy spaces. Then, sintered metals are formed in contact with part of the inner wall of the container by heating the container at predetermined temperature, i.e., at temperature around a melting point of the metal powder, in a state in which the metal powder is filled into the lengthy spaces whose cross-sections are substantially semi-circular.

Next, the core rod is pulled out of the container. When the core rod is pulled out of the container, the sintered metals formed in the spaces formed by the cutaway portions of the core rod and the inner wall of the container are left in contact with the inner wall of the container. When the container is flattened so that the apexes of the semi-elliptical columnar sintered metals contact with each other in this state, the flattened container having a cross-section as shown in FIG. 4 can be obtained and the flattened heat pipe can be fabricated by sealing working fluid.

Figure 5:
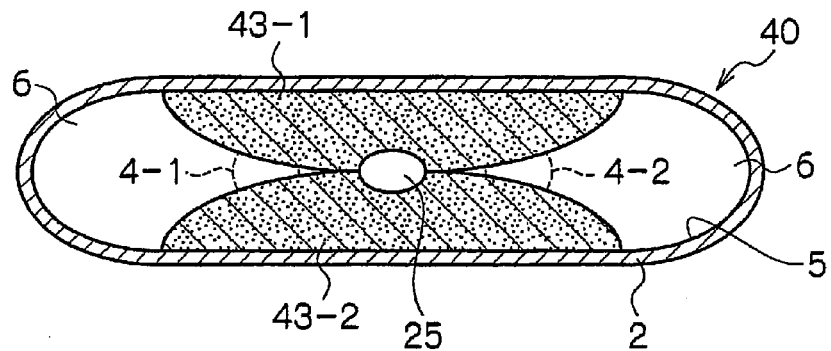
FIG. 5 is a section view explaining a still different mode of the flattened heat pipe of the invention.

FIG. 5 is a section view explaining a still different mode of the flattened heat pipe of the invention. As shown in FIG. 5, a flattened heat pipe 40 of the invention has the closed container 2 formed by flattening a tubular container, a wick structure 43 disposed within the container 2 in the longitudinal direction, the hollow portion 6 and the working fluid sealed into the container 2.

The wick structure 43 described above is composed of two semi-elliptical-columnar metals 43-1 and 43-2, upper and lower ends of the semi-elliptical-columnar metals 43-1 and 43-2 contact respectively with the upper and lower inner walls 5 of the container 2, an apex of the semi-elliptical-columnar metal 43-1 contacts with an apex of the facing semi-elliptical-columnar metal 43-2 and acute-angled portions 4 are formed of contact portions 4-1 and 4-2 of the apexes of the semi-elliptical-columnar metals 43-1 and 43-2. Still more, cross-sectionally semi-circular hollow portion 25 is formed at the apexes of the semi-elliptical-columnar metals 43-1 and 43-2.

As described above, the capillary force strongly acts especially in the acute-angled portions 4 and the working fluid moves quickly by the capillary force in the container through the contact portions 4-1 and 4-2 formed by the respective apexes from the heat radiating portion to the heat absorbing portion in the longitudinal direction of the container. In the same time, it is possible to fully assure the hollow portions 6 formed by the outer peripheral surface of the semi-elliptical-columnar metals 43-1 and 43-2 and the inner wall surface 5 of the flattened container 2 as flow passages, i.e., as vapor flowing passages, where the vaporized working fluid flows from the heat absorbing portion to the heat radiating portion in the longitudinal direction of the container. Still more, the cross-sectionally semi-circular hollow portion formed at the apexes of semi-elliptical-columnar metals 43-1 and 43-2 can be used as a vapor flowing passage.

Figure 9:
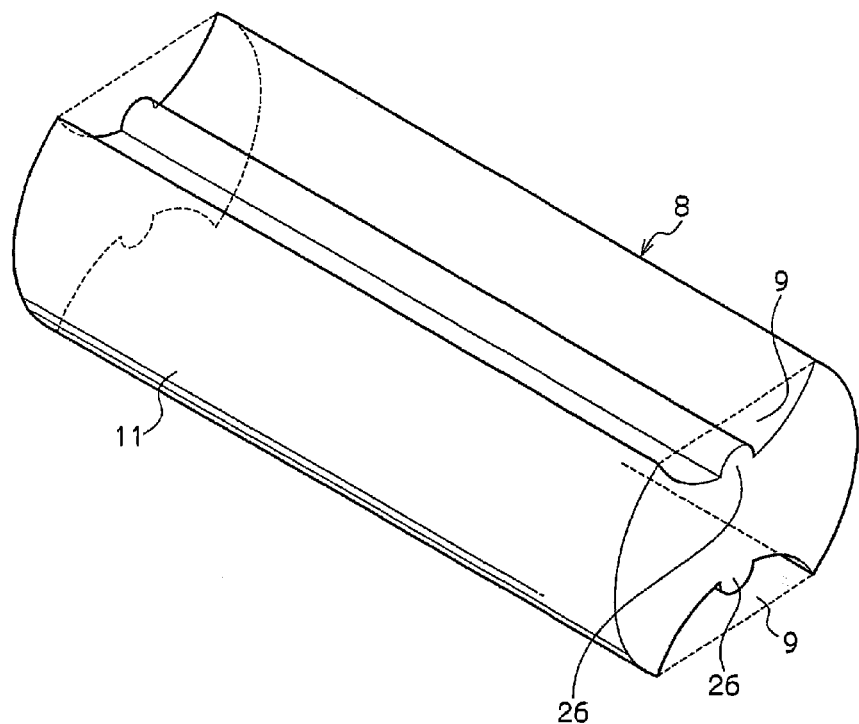
FIG. 9 is a perspective view explaining a core rod having cutaway portions and used in fabricating the flattened heat pipe shown in FIG. 5.

FIG. 9 is a perspective view explaining a core rod having cutaway portions and used in fabricating the flattened heat pipe shown in FIG. 5.

At first, an elliptical tubular container whose cross-section is substantially elliptical is prepared. FIG. 9 shows an elliptical columnar core rod 8 whose cross-section is elliptical and the core rod 8 can be inserted into the elliptical tubular container substantially without any gap between the core rod 8 and the inner wall of the container. Cutaway portions 9, whose cross-sections are substantially semi-elliptical, are provided partly on the core rod 8 along the longitudinal axis of the core rod 8. Cutaway portions have projections 26 whose cross-sections are semi-circular and those projections 26 project inwardly at apexes of the semi-elliptical cross-sections.

The core rod 8 in which the cutaway portions 9 having the projections are formed as described above is inserted into the elliptical tubular container 2. At this time, the core rod 8 is inserted into the container 2 so that the outer peripheral surface 11 of the core rod 8 contacts with the inner wall 5 of the container 2 substantially without any gap.

When the core rod is inserted into the container as described above, two lengthy spaces whose cross-sections are substantially semi-elliptical are formed so as to face with each other with a predetermined distance along the longitudinal direction of the container by the semi-elliptical cutaway portions having the projections and formed in the core rod and the inner wall of the container.

The core rod 8 having the two cutaway portions 9 whose cross-sections are semi-elliptical and having the projections is inserted into the elliptical tubular container 2 in a state in which there is almost no gap between the inner wall 5 of the container 2. By inserting the elliptical columnar core rod having the cutaway portions into the container, two lengthy spaces opposite each other, are formed. Metal powder is then filled into the two lengthy spaces. Then, sintered metals are formed in contact with part of the inner wall of the container by heating the container at predetermined temperature, i.e., at temperature around a melting point of the metal powder, in a state in which the metal powder is filled into the lengthy spaces whose cross-sections are substantially semi-elliptical.

Next, the core rod is pulled out of the container. When the core rod is pulled out of the container, the sintered metals formed in the spaces formed by the cutaway portions of the core rod and the inner wall of the container are left in contact with the inner wall of the container. When the container is flattened so that the apexes of the semi-elliptical columnar sintered metals contact with each other in this state, the flattened container having a cross-section as shown in FIG. 5 can be obtained and the flattened heat pipe can be fabricated by sealing working fluid.

According to another mode of the invention, the flattened heat pipe has a flattened and closed tubular container, at least one wick structure having a curved portion and a flat portion and a working fluid sealed into the container, wherein the curved portion of the wick structure is disposed in contact with or in close proximity to the inner wall of the container by leaving a gap less than a predetermined distance to form refluxing portions that generates capillary force between the curved portion and the inner wall.

Figure 10:
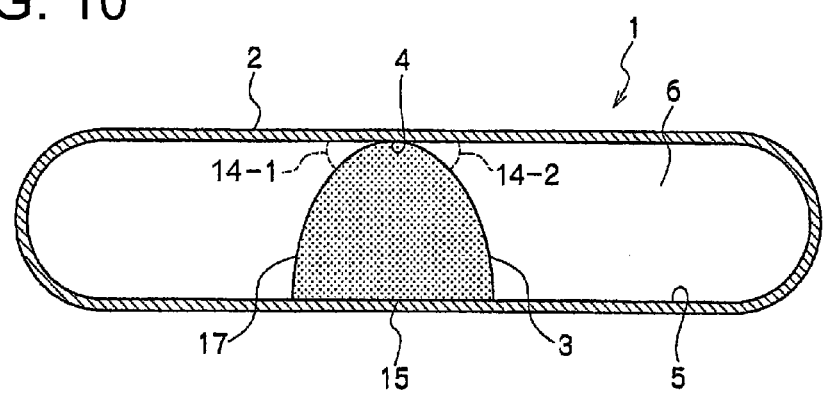
FIG. 10 is a section view explaining one mode of a flattened heat pipe of the invention.

FIG. 10 is a section view explaining one mode of a flattened heat pipe of the invention. As shown in FIG. 10, a flattened heat pipe 1 of the invention has the closed container 2 formed by flattening a tubular container, a wick structure 3 formed of sintered metal having a curved portion 17 and a flat portion 15 and disposed within the container 2 in the longitudinal direction, the hollow portion 6 formed by the outer peripheral surface of the wick structure 3 and the inner wall 5 of the container 2 and the working fluid not shown sealed within the container 2.

The wick structure 3 is disposed in close proximity to the container 2 by setting a space less than a predetermined distance between an apex 4 of the wick structure 3 and the inner wall 5 of the container 2. In the mode shown in FIG. 10, the wick structure 3 is composed of one semi-elliptical columnar sintered metal, the apex 4 formed of the curved portion of the semi-elliptical columnar sintered metal is disposed in close proximity to the upper inner wall 5 of the container 2 by leaving a gaps less a predetermined distance and the flat portion 15 contacts with the lower inner wall 5 of the container 2. Refluxing portions are formed of proximate portions 14-1 and 14-2 formed by the apex 4 of the wick structure 3 and the inner wall 5 of the container.

As described above, the capillary force strongly acts especially in the refluxing portions and the working fluid can be moved quickly by the capillary force from the heat radiating portion to the heat absorbing portion in the longitudinal direction of the container. In the same time, it is possible to fully assure the hollow portions 6 formed by the outer peripheral surface of the wick structure 3 and the inner wall surface 5 of the flattened container 2 as flow passages, i.e., as vapor flowing passages, where the vaporized working fluid flows from the heat absorbing portion to the heat radiating portion in the longitudinal direction of the container.

It is not always necessary to contact the wick structure 3 with the inner wall 5 of the container or among the wick structures 3 and it is possible to generate desirable capillary force by the refluxing portions to be formed even when they are disposed in close proximity to each other by leaving a gap less a predetermined distance. A relationship between the gaps between the sintered metals and maximum heat transporting quantities in the flattened heat pipe has been studied as follows.

As a flattened heat pipe, a heat pipe having a cross-section as shown in FIG. 13C is used. In the flattened heat pipe, wick structures respectively composed of semi-elliptical columnar sintered metals are formed on upper and lower inner walls of a container and apexes of the sintered metals are disposed in contact with or in close proximity to each other.

The heat pipe used here has an outer diameter of φ6 mm before flattening and a length of 200 mm. When the gap between the sintered metals formed on the upper and lower inner walls is zero, it represents a state in which the apexes of the sintered metals contact with each other in terms of design. It is noted that when the gap is minus, it represents a state in which the apexes of the sintered metals are plastically deformed and squashed in terms of design by being flattened after the sintered metals contact with each other.

FIG. 13B is a table showing maximum heat transporting quantities when the vertical sintering gaps are varied. The maximum heat transporting quantity represents a maximum quantity of heat (W) that can be transported by a heat pipe. The table represents respective results and their average of sample Nos. 1 through 3. In the sample No. 1, the maximum heat transporting quantity is 49 W and is highest in a state in which the sintered metals press with each other, i.e., when the vertical sintering gap is minus 0.2. The sample No. 1 presents high heat transporting quantity of 45 W also when the vertical sintering gaps are minus 0.4, zero and 0.2. In the sample No. 2, the maximum heat transporting quantity is 50 W and is highest when the vertical sintering gap is zero. The heat transporting quantity is as high as 46 W when the vertical sintering gap is minus 0.2. The heat transporting quantities are 39 W and 35 W respectively when the vertical sintering gaps are minus 0.4 and 0.2.

In the sample No. 3, the maximum heat transporting quantity is 50 W and highest when the vertical sintering gap is zero. Then, the maximum heat transporting quantity is 41 W and is high when the vertical sintering gap is 0.2 and 40 W when the vertical sintering gaps are minus 0.2 and minus 0.4. However, it can be seen that the heat transporting quantities of the all sample Nos. 1 through 3 drop to 2.5 W or less and the heat transporting power drop when the vertical sintering gap is 1.8. As average values (Average) show, the heat transporting quantity exceeds 40 W and no significant drop of performance is seen when the vertical sintering gap falls into a range from minus 0.4 to 0.2 mm.

FIG. 13A is a graph showing these results. In the graph, an axis of ordinate represents the maximum heat transporting quantities (W) and an axis of abscissa represents the vertical sintering gaps (mm), respectively. As a result, the predetermined distance of the gap, that is the minimum distance to cause the heat transporting effectively, is about 1.0 mm.

It is noted that the gap between the sintered metals described above may be the gap between the apexes of the sintered metals as shown in FIG. 13C, the invention is not limited to that case and the same effect can be obtained also between the apex 4 of the sintered metal and the inner wall 5 of the container in the heat pipe shown in FIG. 10. Still more, when a plurality of sintered metals is disposed by being displaced in the vertical direction, the gap by which the sintered metals are close proximity to each other may be 1.0 mm or less (0-1.0 mm).

Figure 11:
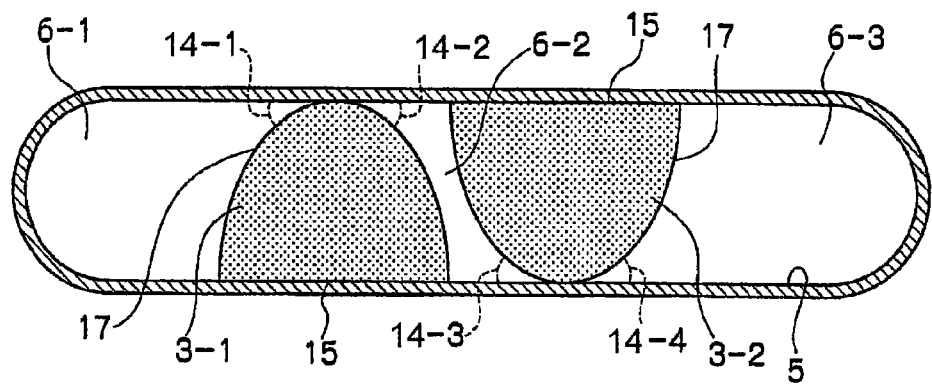
FIG. 11 is a section view explaining another mode of the flattened heat pipe of the invention.

FIG. 11 is a section view explaining another mode of the flattened heat pipe of the invention. As shown in FIG. 11, a flattened heat pipe 1 of the present mode has the closed container 2 formed by flattening a tubular container, a wick structure 3 composed of two wicks 3-1 and 3-2 disposed within the container 2 in the longitudinal direction, hollow portions 6 formed by the outer peripheral surfaces of the wick structure 3 and the inner wall 5 of the container 2 and the working fluid not shown sealed within the container 2.

The wicks 3-1 and 3-2 described above are formed of two semi-elliptical columnar sintered metals disposed closely with each other. The two semi-elliptical columnar sintered metals are disposed so that their upper ends are close proximity respectively to upper and lower inner walls 5 of the container 2 by leaving a gap less than the predetermined distance and so that their flat portions 15 are in contact respectively with the inner walls 5 of the container 2.

The hollow portion 6-2 is formed by outer peripheral surfaces opposite each other of the neighboring two wicks 3-1 and 3-2 and the upper and lower inner walls of the container. Still more, the separate hollow portions 6-1 and 6-3 are formed by the other outer peripheral surfaces of the wicks 3-1 and 3-2 and the inner wall 5 of the container.

Then, refluxing portions are formed of proximity portions 14-1, 14-2, 14-3 and 14-4 formed by the apexes of the wicks 3-1 and 3-2 and the inner wall 5 of the container.

As described above, the capillary force strongly acts especially in the refluxing portions and the working fluid moves quickly by the capillary force in longitudinal direction of the container through the proximity portions 14-1, 14-2, 14-3 and 14-4 from the heat radiating portion to the heat absorbing portion. In the same time, it is possible to fully assure the hollow portions 6-1, 6-2 and 6-3 within the flattened container 2 described above as flow passages, i.e., as vapor flowing passages, where the vaporized working fluid flows from the heat absorbing portion to the heat radiating portion in the longitudinal direction of the container.

Figure 12:
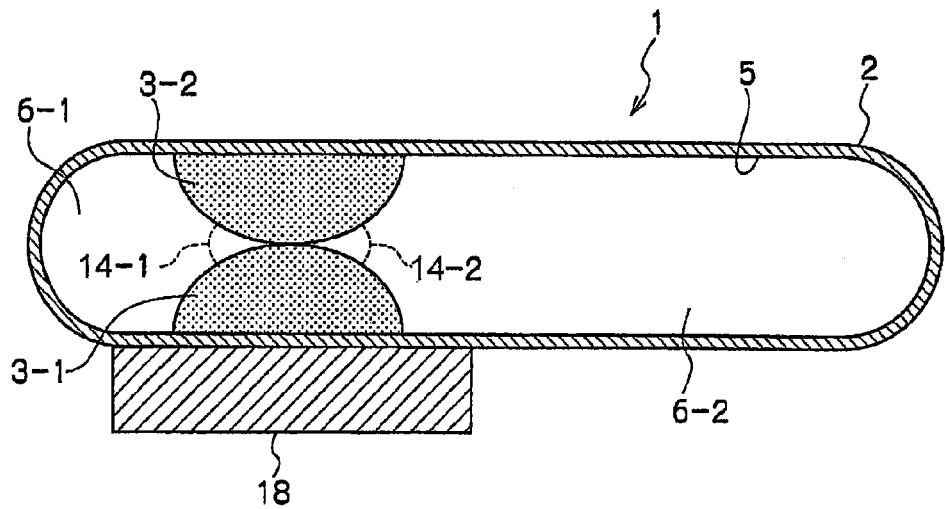
FIG. 12 is a section view explaining a different mode of the flattened heat pipe of the invention.

FIG. 12 is a section view explaining a different mode of the flattened heat pipe of the invention. As shown in FIG. 12, a flattened heat pipe 1 of the present mode has the closed container 2 formed by flattening a tubular container, a wick structure 3 composed of wicks 3-1 and 3-2 disposed within the container 2 in the longitudinal direction, hollow portions 6-1 and 6-2 and the working fluid not shown and sealed into the container 2.

The wick structure 3 described above is composed of two semi-elliptical columnar sintered metals disposed in the vertical direction, flat portions 15 of the wicks 3-1 and 3-2 are in contact respectively with upper and lower inner walls 5 of the container 2, apexes of the wicks 3-1 and 3-2 contact or are disposed in close proximity by leaving a gap less than a predetermined distance. Refluxing portions are formed of proximate portions 14-1 and 14-2 formed by the apexes of the wicks 3-1 and 3-2, respectively. It is noted that in the mode shown in FIG. 12, the wick structure 3 described above is provided at part corresponding to a region where the flattened container 2 is thermally connected to an exothermic part 18.

As described above, the capillary force strongly acts especially in the refluxing portions and the working fluid moves quickly by the capillary force in longitudinal direction of the container through the proximity portions 14-1 and 14-2 from the heat radiating portion to the heat absorbing portion. In the same time, it is possible to fully assure the hollow portions 6-1 and 6-2 within the flattened container 2 described above as flow passages, i.e., as vapor flowing passages, where the vaporized working fluid flows from the heat absorbing portion to the heat radiating portion in the longitudinal direction of the container. Because this flattened heat pipe has the large hollow portion 6-2 in particular, the vaporized working fluid flows readily.

Figure 14A:
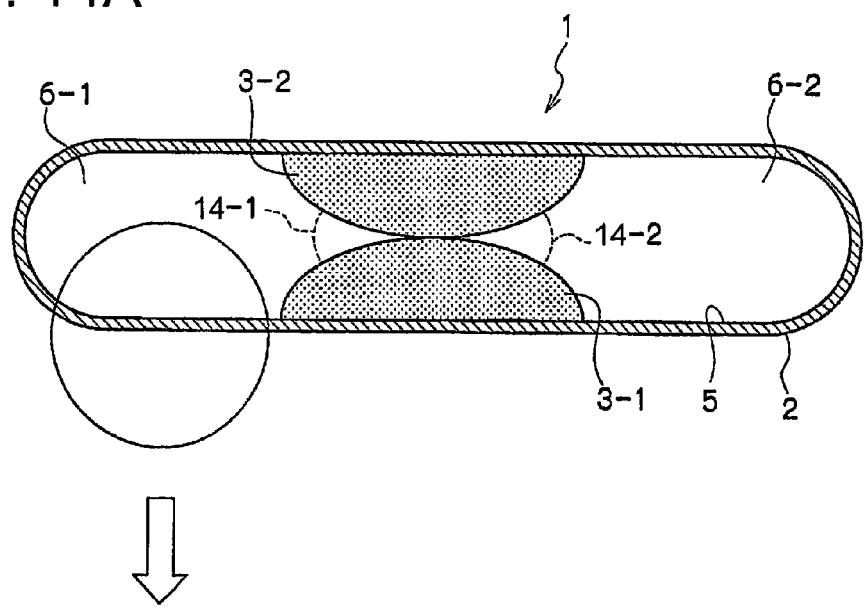
FIG. 14A is a section view explaining one mode of the flattened heat pipe of the invention.

FIG. 14A is a section view explaining another mode of the flattened heat pipe of the invention. In the mode shown in FIG. 14, the two wicks 3-1 and 3-2 explained with reference to FIG. 12 and disposed in the vertical direction are disposed approximately at the center of the container and the inner wall of the container includes concavo-convex portions.

Figure 14B:
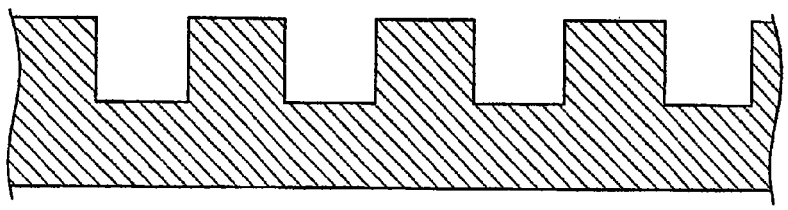
FIG. 14B is an enlarged view of a part surrounded by a circle in FIG. 14A

FIG. 14B is an enlarged view of a part surrounded by a circle in FIG. 14A. As shown in FIG. 14B, concavo-convex portions so-called grooves are formed across the whole length in the longitudinal direction of the container. It is possible to enhance the capillary force of the flattened heat pipe, facilitate the reflux of the working fluid and to enhance heat radiating efficiency of the heat pipe by forming the grooves formed of the concave-convex portions in the inner wall of the container.

Next, a manufacturing method of the flattened heat pipe of the invention shown in FIG. 14 will be explained.

The flattened heat pipe of the invention can be fabricated through the method comprising steps of preparing a tubular container, inserting a core rod having cutaway portions of a predetermined shape into the container, filling metal powder into spaces formed by the cutaway portions and the inner wall of the container, heating the container in a state in which the metal powder is filled and core rod is inserted to prepare sintered powder and to form sintered metals, pulling the core rod out of the container, flattening the container and sealing a working fluid into the container.

Figure 15A:
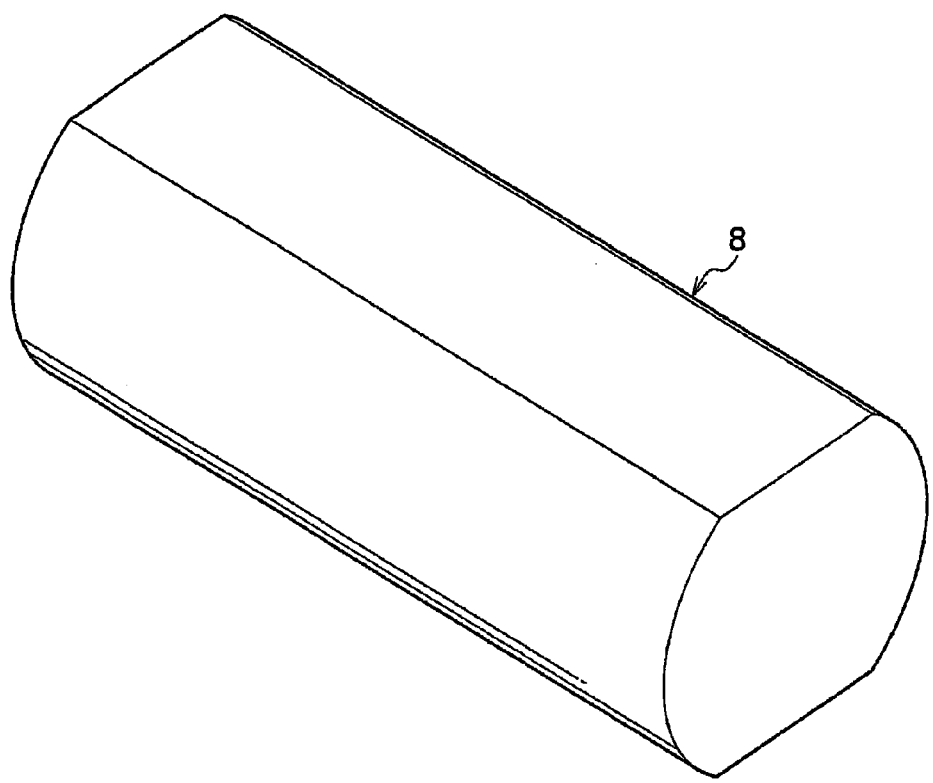
FIG. 15A is a perspective view showing a core rod having cutaway portions and FIG. 15B is a section view showing a state in which the core rod is inserted into a tubular container.

A manufacturing method of the flattened heat pipe of the invention will be explained below with reference to FIGS. 15A and 15B. FIG. 15A is a perspective view showing a core rod having cutaway portions and FIG. 15B is a transversal section view showing a state in which the core rod is inserted into a tubular container.

At first, a substantially cylindrical tubular container is prepared. Then, as shown in FIG. 15(*a*), a columnar core rod 8 that can be inserted into the inner wall of the tubular container without any gap is provided with cutaway portions 9 formed by cutting parts of a circular arc in section along the longitudinal axis of the core rod 8. The shape of the cutaway portion 9 may be pillar or columnar e.g. The core rod in which the cutaway portions 9 are formed as described above is inserted into the tubular container 2. At this time, the core rod 8 is inserted into the container 2 so that the outer peripheral surface 11 of the core rod 8 in contact with the inner wall 5 of the container 2 substantially without any gap.

Figure 15B:
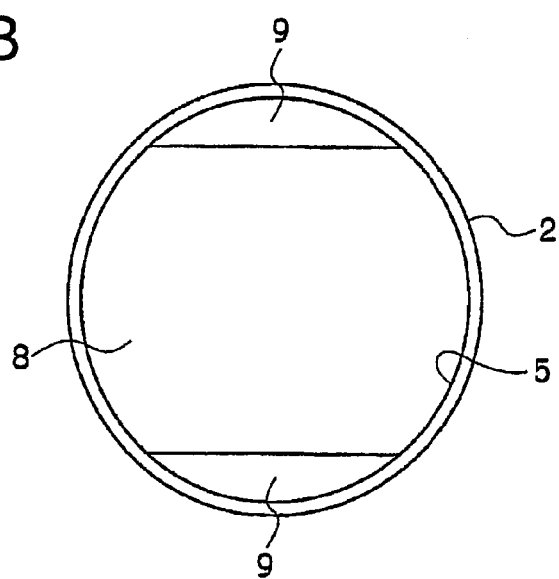

As shown in FIG. 15B, the columnar core rod 8 having the cutaway portions 9 is inserted into the cylindrical container 2 in a state in which there is almost no gap between the inner wall 5 of the container 2. Because the cutaway portions 9 are columnar as described above, the two pillar spaces cross-sectionally formed of substantially flat and circular portions are formed by the inner wall 5 of the cylindrical container 2 and the two cutaway portions 9.

Next, metal powder is filled into the columnar lengthy spaces formed by inserting the columnar core rod having the cutaway portions into the cylindrical container as described above. A material of the metal powder is copper, bronze, stainless or the like for example. The powder may be globular or deformed powder. It is possible to adjust voids of the sintered metals described later by controlling size of the metal powder.

The sintered metals are formed in contact with part of the inner wall of the container by heating the container at predetermined temperature, i.e., at temperature around a melting point of the metal powder, in a state in which the metal powder is filled into the two columnar lengthy spaces. The sintered metals are formed in a state in which the metal powders are linked as described above, so that voids are prone to be formed and the capillary force is strong, thus facilitating the move of the working fluid.

Next, the core rod is pulled out of the container. When the core rod is pulled out of the container, the sintered metals formed in the spaces formed by the cutaway portions of the core rod and the inner wall of the container are left in contact with the inner wall of the container. That is, the two long-pillar sintered metals are formed in contact with the inner wall of the cylindrical container by leaving a gap along the longitudinal direction of the container. FIG. 14(*a*) is a section view showing a state in which the container in which the sintered metals are formed as described above is flattened. Flattened portions at center parts of the container are required to be highly flat to thermally connect with a heat source.

Figure 16:
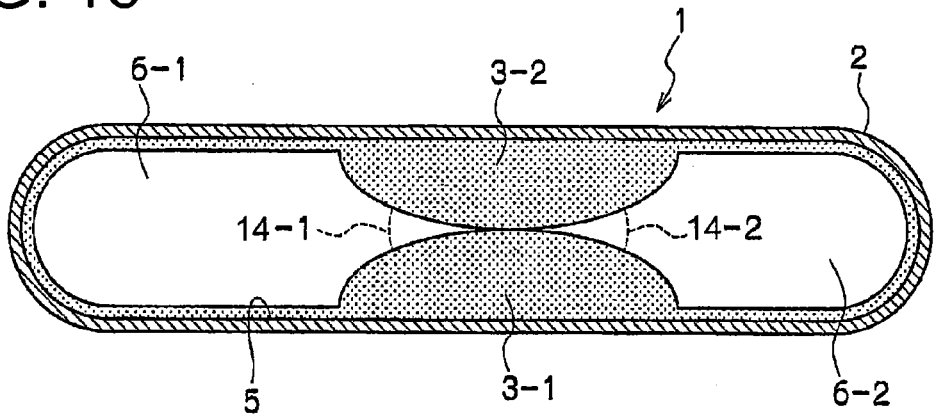
FIG. 16 is a section view explaining a still different mode of the flattened heat pipe of the invention.

FIG. 16 is a section view explaining a still different mode of the flattened heat pipe of the invention. In this mode, sintered metals are formed as a thin layer on the inner wall of the container so as to cover the whole range of the inside of the container 2. Wicks 3-1 and 3-2 are formed respectively into cross-sectionally substantially semi-elliptical shapes on the upper and lower sides of the flat portion of the container 2 and apexes thereof are in contact or in close proximity to each other by leaving a gap less than the predetermined distance. That is, in this mode, the wick structure 3 is formed of the thin-layered sintered metal covering the whole range of the inner wall 5 integrally formed with the semi-elliptical columnar sinter metals at the flat portions of the container. It is possible to enhance the capillary force in the whole inner wall 5 of the container by covering the whole inner wall 5 of the container by the thin-layered sintered metal. The capillary force strongly acts especially in the refluxing portions also in this mode and the working fluid moves the proximity portions 14-1 and 14-2 formed by the apexes of the semi-elliptical columnar sintered metals quickly by the capillary force from the heat radiating portion to the heat absorbing portion along the longitudinal direction of the container.

Figure 17:
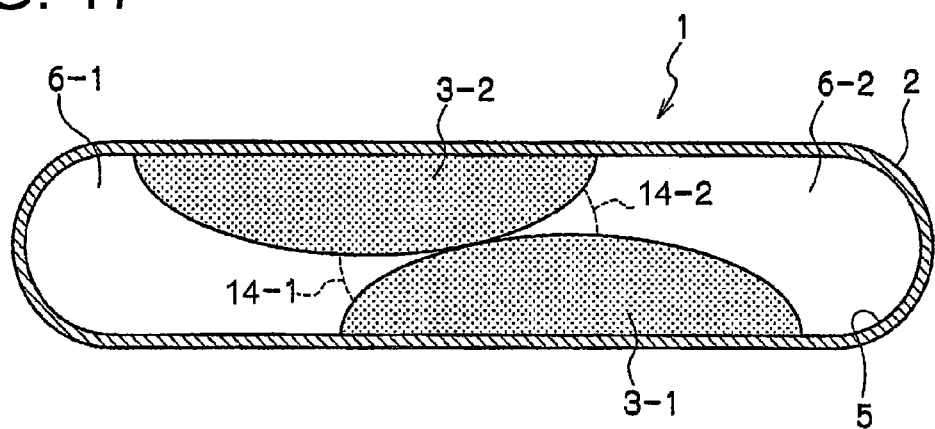
FIG. 17 is a section view explaining a further different mode of the flattened heat pipe of the invention.
Figure 18:
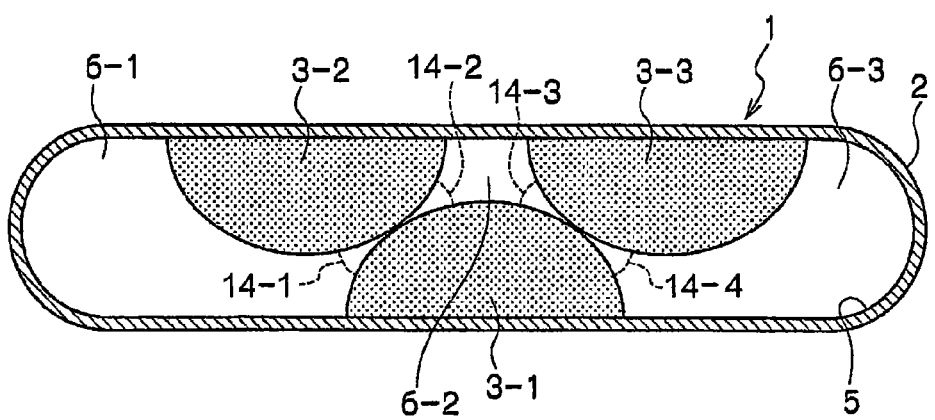
FIG. 18 is a section view explaining a still different mode of the flattened heat pipe of the invention.

FIGS. 17 and 18 are section views explaining further different modes of the flattened heat pipe of the invention. The modes shown in FIGS. 17 and 18 are modified examples. That is, in the mode shown in FIG. 17, the upper and lower semi-elliptical columnar sintered metals are disposed by displacing center axes thereof. Curved portions of the neighboring semi-elliptical columnar sintered metals are partially in contact or in close proximity to each other by leaving a gap less than the predetermined distance and proximity portions 14-1 and 14-2 form refluxing portions also in this mode. Still more, according to this mode, because the semi-elliptical columns are disposed by displacing their apexes, it becomes possible to thin a thickness of the container 2.

In the mode shown in FIG. 18, a plurality of wick structures is disposed respectively on parts opposite each other of the inner wall of the container. That is, as shown in FIG. 18, in the cross-section of the container 2, two semi-elliptical columnar sintered metals 3-2 and 3-3 are disposed by leaving a predetermined distance on the upper inner wall 5 and one semi-elliptical columnar sintered metals 3-1 is disposed on the lower inner wall 5 while facing to the substantially center between the two semi-elliptical columnar sintered metals 3-2 and 3-3 described above so that their curved portions are in contact or in close proximity to each other by leaving a gap less than the predetermined distance. The capillary force strongly acts especially in the refluxing portions also in this mode and the working fluid moves the proximity portions 14-1, 14-2, 14-3 and 14-4 formed by the curved portions of the semi-elliptical columnar sintered metals quickly by the capillary force from the heat radiating portion to the heat absorbing portion along the longitudinal direction of the container. The function of the hollow portions 6-1, 6-2 and 6-3 is almost the same with other modes.

Although the sintered metals composing the wick structure disposed on the inner wall of the container of the flattened heat pipe described above is formed of a substantially same thickness as a whole, the thickness of the sintered metals forming the wick structure can be changed.

Figure 19:
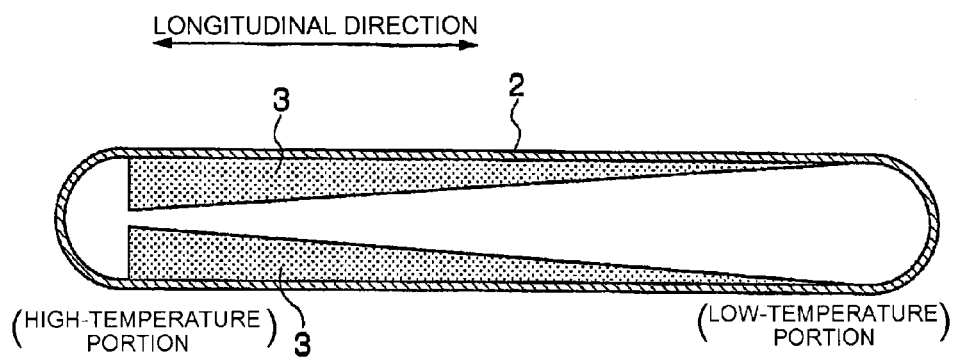
FIG. 19 is a section view explaining another mode of the flattened heat pipe of the invention.
Figure 20:
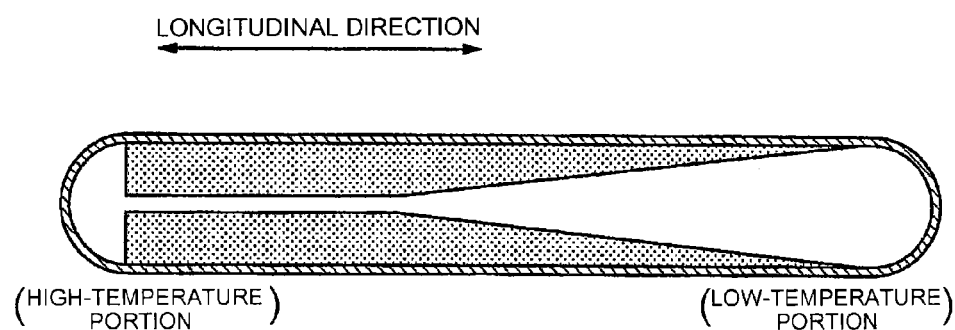
FIG. 20 is a section view explaining a still other mode of the flattened heat pipe of the invention.

FIGS. 19 and 20 are longitudinal section views of other modes of the flattened heat pipe of the invention. In the modes shown in FIGS. 19 and 20, the thickness of the sintered metals forming the wick structure is changed.

In the mode shown in FIG. 19, a thickness of the sintered metal is about the same until a predetermined region of a high-temperature portion of the container and a thickness of the sintered metal disposed from the predetermined region to a low-temperature portion is thinned gradually. Because it is possible to facilitate the working fluid to reflux to the high-temperature portion and to increase the vapor flowing passage area by constructing the sintered metals (the wick structure 3), heat can be moved more efficiently. In order to change the thickness of the sintered metals in the longitudinal direction of the container 2, a core rod that changes into a predetermined shape in the longitudinal direction may be used in a manufacturing process of the flattened heat pipe described above.

Figure 21:
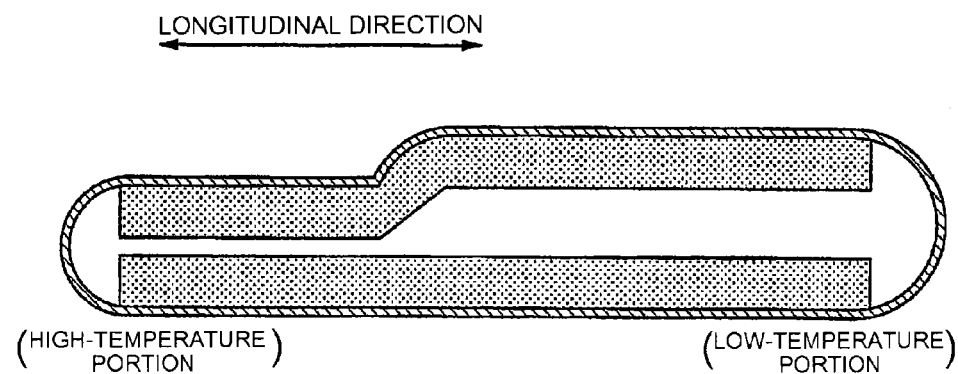
FIG. 21 is a section view explaining a different mode of the flattened heat pipe of the invention.

Still more, in the mode shown in FIG. 21, the thickness of the container changes and the container has thin and thick regions. The thickness of the sintered metals disposed is about the same in the whole regions in the mode in which the thickness of the container itself changes. It is possible to obtain the same effect with the flattened heat pipe described above with reference to FIG. 20 can be obtained by constructing the shape of the container 2 as described above. Still more, according to the mode shown in FIG. 21, the thickness of the high-temperature portion, i.e., the thickness of the heat pipe at the part where the exothermic element is disposed can be thinned, so that a heat pipe disposing space can be utilized more efficiently.

The flattened heat pipe can be fabricated by appropriately combining the disposition of the sintered metals described in the cross-section within the container described above and the disposition of the sintered metals explained with reference FIGS. 19 and 20. It is noted that although the shape of the heat pipe is desirable to be the flat shape whose both surfaces are flat as described above, the invention is not always limited to that and at least one surface receiving heat can be flat.

INDUSTRIAL APPLICABILITY

According to the invention, it is possible to obtain the thin heat pipe that allows the wick parts having the excellent capillary force for moving the liquid-phase working fluid and the enough voids as the vapor flowing passages to be assured and that has a large heat transporting capability even if the heat absorbing portion is located above the heat radiating portion. Thus, the industrial applicability of the invention is remarkable.

BRIEF DESCRIPTION OF REFERENCE NUMERALS

1, 10, 20, 30, 40 flattened heat pipe
2 container
3 wick structure 4 acute-angled portion, apex
4-1 through 4-8, 14-1 through 14-4 contact portion
5 inner wall of container
6 hollow portion
7 hollow portion within tubular mesh
8 core rod
9 cutaway portion
11 outer peripheral surface of core rod
15 flat portion
17 curved portion
18 exothermic part
25 cross-sectionally semicircular hollow portion

The invention claimed is:

1. A flattened heat pipe, comprising:
a flat and tubular closed container;
a plurality of wick structures; and
a working fluid sealed into the container, wherein
the wick structures consist of sintered metals formed of sintered globular or deformed powder,
wherein each wick structure in the container have a semi-elliptical cross-sectional shape having curved portions and flat portions, and an entire interior of the wick structures consists of the sintered metals,
the flat portions of the wick structures are in contact with an upper inner wall and a lower inner wall of the container respectively,
vapor flowing passages are formed at least in curved areas of both sides of the container,
respective apexes of the curved portions of two adjacent wick structures of the plurality of wick structures are in direct contact with each other, such that each of the adjacent wick structures has a contact portion with the curved portion of the other wick structure of the adjacent wick structures,
the contact portion of each of the apexes is plastically-deformed from the vertical direction and flattened by the curved portion of the other wick structure such that each wick structure includes the flat portion in contact with the respective upper and lower inner walls of the container and a flattened apex portion in contact with the adjacent wick structure,
an angle formed between the flattened contact portions and the curved portions of the adjacent wick structures forms an acute angle portion, and
the contact portion is plastically deformed by at most 0.4 mm.

2. The flattened heat pipe according to claim 1, wherein a distance between neighboring curved portions of the wick structures is equal to 1.0 mm or less than 1.0 mm.

3. The flattened heat pipe according to claim 1, wherein a capillary force is generated between neighboring curved portions, while a capillary force is also generated in voids formed in the sintered metals.

4. The flattened heat pipe according to claim 1, wherein at least a portion of the inner wall of the container is not in contact with the wick structures.

* * * * *